United States Patent
Lee et al.

(10) Patent No.: US 9,134,573 B2
(45) Date of Patent: Sep. 15, 2015

(54) METHOD OF PRODUCING PHOTO-ALIGNMENT LAYER OF LIQUID CRYSTAL DISPLAY

(71) Applicant: Samsung Display Co., Ltd., Yongin, Gyeonggi-Do (KR)

(72) Inventors: Mi Hwa Lee, Seoul (KR); Suk Hoon Kang, Seoul (KR); Yeong Rong Park, Namyangju-si (KR); Jun-Woo Lee, Seongnam-si (KR); Baek Kyun Jeon, Yongin-si (KR)

(73) Assignee: SAMSUNG DISPLAY CO., LTD. (KR)

(*) Notice: Subject to any disclaimer, the term of this patent is extended or adjusted under 35 U.S.C. 154(b) by 0 days.

(21) Appl. No.: 14/445,241

(22) Filed: Jul. 29, 2014

(65) Prior Publication Data

US 2015/0104893 A1  Apr. 16, 2015

(30) Foreign Application Priority Data

Oct. 15, 2013  (KR) .................. 10-2013-0122830

(51) Int. Cl.
| | |
|---|---|
| *G02F 1/1337* | (2006.01) |
| *G02F 1/1368* | (2006.01) |
| *G02F 1/1333* | (2006.01) |
| *H01L 27/12* | (2006.01) |

(52) U.S. Cl.
CPC ........ *G02F 1/133788* (2013.01); *G02F 1/1368* (2013.01); *G02F 1/133345* (2013.01); *G02F 1/133723* (2013.01); *H01L 27/1259* (2013.01)

(58) Field of Classification Search
CPC .............. G03F 7/0002; G02F 1/13378; G02F 1/133743; G02F 1/133723; G02F 1/133788; G02F 1/1368; G02F 1/133345; G02F 2001/133742; G02F 2001/133757; G02F 1/1337; H01L 27/1259

USPC .................. 349/123, 129, 130, 187
See application file for complete search history.

(56) References Cited

U.S. PATENT DOCUMENTS 8,648,988 B2 * 2/2014 Kunimatsu et al. ........... 349/135
2002/0085165 A1 7/2002 Fukumoto et al.

FOREIGN PATENT DOCUMENTS

| JP | 2009-282377 A | 12/2009 |
| JP | 4759804 B2 | 6/2011 |
| JP | 4972433 B2 | 4/2012 |
| KR | 1020080079138 A | 8/2008 |
| KR | 1020080090680 A | 10/2008 |
| KR | 1020100065517 A | 6/2010 |

OTHER PUBLICATIONS

Goto et al., "Novel Photoalignment Layer for in Plane Switching Mode LCD Using 313 nm Ultraviolet Light," in SID May 2013, vol. XLIV, Book II, pp. 537-540.
Kawatsuki et al, "Photoalignment control of liquid crystals on photocross-linkable polymer liquid crystal film and its application to polarization gratings", Proc. of SPIE, vol. 5936, 2005, pp. 593608-1-593608-7.

* cited by examiner

*Primary Examiner* — Thoi Duong
(74) *Attorney, Agent, or Firm* — Cantor Colburn LLP (57) ABSTRACT

A method of manufacturing a photo-alignment layer, includes: disposing a polymer material on a substrate; pre-baking the polymer material disposed on the substrate; irradiating a light to the pre-baked polymer material, to photo-align the pre-baked polymer material; and thermal-treating the irradiated pre-baked polymer material, to harden the irradiated pre-baked polymer material. The thermal-treating includes a first thermal-treatment, and a second thermal-treatment at a higher temperature than the first thermal-treatment.

20 Claims, 9 Drawing Sheets

METHOD OF PRODUCING PHOTO-ALIGNMENT LAYER OF LIQUID CRYSTAL DISPLAY

This application claims priority to Korean Patent Application No. 10-2013-0122830 filed on Oct. 15, 2013, and all the benefits accruing therefrom under 35 U.S.C. §119, the entire contents of which are incorporated herein by reference.

BACKGROUND (a) Field

The invention relates to a manufacturing method of a photo-alignment layer of a liquid crystal display.

(b) Description of the Related Art

In a liquid crystal display, liquid crystals are disposed between substrates, such as transparent conductive glass, of a liquid crystal display panel. For the liquid crystal display to display images, that is, to change alignment of and switch the liquid crystals between the substrates through an external electrical field, the liquid crystals must be aligned in a predetermined direction at the interface between the liquid crystal and the substrates. The degree of uniformity of the liquid crystal alignment is an important factor for determining the display quality of the liquid crystal display.

In a conventional method of aligning the liquid crystals, a rubbing method is used, where a polymer layer such as a polyimide is coated on a substrate such as glass and the surface is rubbed in a predetermined direction by using a fiber material such as nylon or polyester. However, minute particles or an electrostatic discharge ("ESD") may be generated when the fiber material and the polymer layer are rubbed against each other, and the generated minute particles or ESD may cause a serious problem during the manufacturing of the liquid crystal panel of the liquid crystal display.

SUMMARY

The invention provides a manufacturing method of an alignment layer of a liquid crystal display that improves an afterimage, luminance, and a contrast ratio of the liquid crystal display, by heat-treating an alignment layer by two processes when manufacturing a photo-alignment material layer of the liquid crystal display.

According to an exemplary embodiment of the invention, a manufacturing method of a photo-alignment layer includes: disposing a polymer material on a substrate; pre-baking the polymer material disposed on the substrate; irradiating a light to the pre-baked polymer material, to photo-align the pre-baked polymer material; and thermal-treating the irradiated pre-baked polymer material, to harden the irradiated pre-baked polymer material. The thermal-treating includes a first thermal-treatment, and a second thermal-treatment at a higher temperature than that of the first thermal-treatment.

The polymer material may include a main chain and a side chain.

The polymer material may include a polyimide or polyamic acid.

The first thermal-treatment may be performed at a temperature of about 140 degrees Celsius (° C.) to about 180° C., and the second thermal-treatment may be performed at a temperature of about 190° C. to about 230° C.

The first thermal-treatment and the second thermal-treatment may be performed for about 20 minutes to about 40 minutes.

The first thermal-treatment may stabilize a polymer shape and increase anisotropy of the polymer material.

The second thermal-treatment may imidize the polyimide or the polyamic acid of the polymer material.

The pre-baking may be performed at a temperature of about 70° C. to about 80° C.

The pre-bake may be performed for about 60 seconds to about 80 seconds.

The light may be ultraviolet ("UV") rays.

According to another exemplary embodiment of the invention, a manufacturing method of a liquid crystal display includes: forming a thin film transistor on a first substrate; forming a passivation layer on the thin film transistor; forming a first electrode and a second electrode positioned via an insulating layer interposed therebetween, on the passivation layer; and forming a first photo-alignment layer on the first electrode or the second electrode. The forming of the first photo-alignment layer includes: disposing a polymer material on a substrate; pre-baking the polymer material disposed on the substrate; irradiating a light to the pre-baked polymer material, to photo-align the pre-baked polymer material; and thermal-treating the irradiated pre-baked polymer material, to harden the irradiated pre-baked polymer material. The thermal-treating includes a first thermal-treatment, and a second thermal-treatment at a higher temperature than that of the first thermal-treatment.

The method may further include forming a second photo-alignment layer on a second substrate facing the first substrate.

As described above, one or more exemplary embodiment of the manufacturing method of the photo-alignment layer according to the invention includes the thermal-treatment of the photo-alignment layer in two processes. In detail, the thermal-treatment of the photo-alignment layer is performed two times at the different temperatures to improve the alignment characteristic of the photoreactive material in the photo-alignment layer such that the afterimage, the luminance, and the contrast ratio of the liquid crystal display including the photo-alignment layer may be improved.

BRIEF DESCRIPTION OF THE DRAWINGS

The above and other features of this disclosure will become more apparent by describing in further detail exemplary embodiments

DETAILED DESCRIPTION

The invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the invention.

In the drawings, the thickness of layers, films, panels, regions, etc., are exaggerated for clarity. Like reference numerals designate like elements throughout the specification. As used herein, the term "and/or" includes any and all combinations of one or more of the associated listed items. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

In a liquid crystal display, liquid crystals are disposed between substrates, such as transparent conductive glass, of a liquid crystal display panel. A polymer layer such as a polyimide, for forming an alignment layer of the liquid crystal display panel, may be coated on a substrate. A photo-alignment method has been researched, in which anisotropy is provided to the polymer layer by light irradiation, to align the liquid crystals in a predetermined direction.

Hereinafter, the invention will be described in detail with reference to the accompanying drawings.

An exemplary embodiment of a manufacturing method of a photo-alignment layer according to the invention will be described with reference to FIG. 1 to FIG. 5.

The material to which a light alignment method is applied, is a polymer having an optical functional reactor such as azobenzene, cumarin, chalcone, and cinnamate. These polymers are anisotropically reacted with an optical isomer or photo-crosslinker by irradiation of polarized light such that polymer anisotropy is formed on the surface of the polymer layer thereby aligning the liquid crystal in the predetermined direction.

Figure 1:
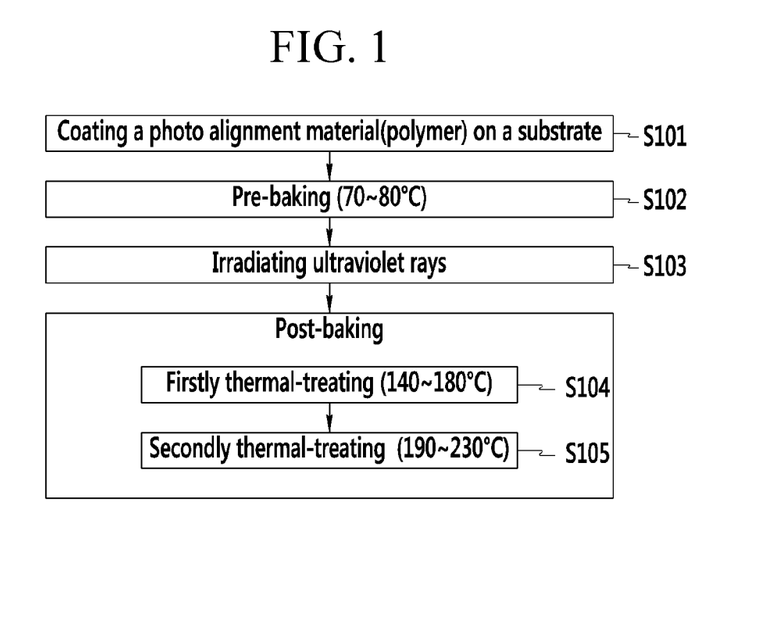
FIG. 1 is a flowchart showing an exemplary embodiment of a manufacturing method of a photo-alignment layer according to the invention.

FIG. 1 is a flowchart showing an exemplary embodiment of a manufacturing method of a photo-alignment layer according to the invention. FIG. 2 to FIG. 5 are views illustrating an exemplary embodiment of a manufacturing method of a photo-alignment layer according to the invention.

Referring to FIG. 1, an exemplary embodiment of a manufacturing method of a photo-alignment layer according to the invention includes coating a polymer material (e.g., a photo-alignment material) on a substrate (S101), pre-baking the polymer material coated on the substrate at a temperature of about 70 degrees Celsius (° C.) to above 80° C. (S102), irradiating ultraviolet ("UV") rays to the pre-baked polymer material (S103), firstly thermal-treating the polymer material irradiated with UV rays at a temperature of about 140° C. to about 180° C. (S104), and secondly thermal-treating the polymer material that is firstly thermal-treated at a temperature of about 190° C. to about 230° C., and each operation is described in further detail below.

Figure 2:
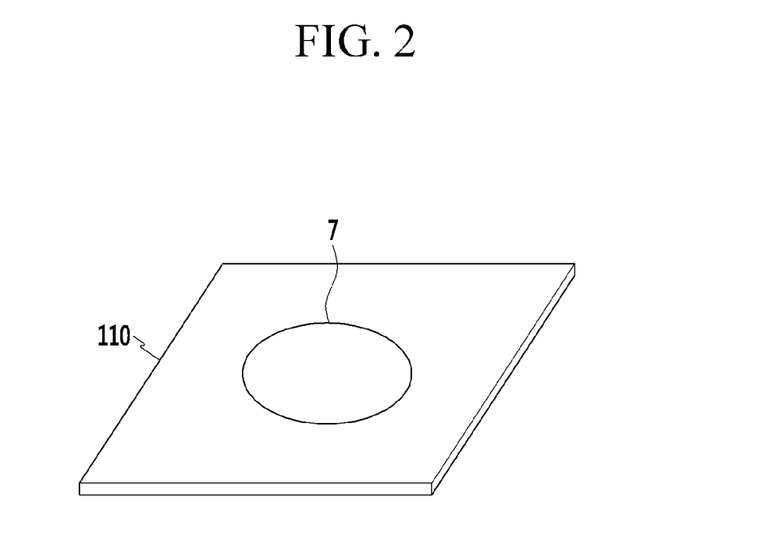
FIG. 2 to FIG. 5 are views illustrating an exemplary embodiment of a manufacturing method of a photo-alignment layer according to the invention.
Figure 5:
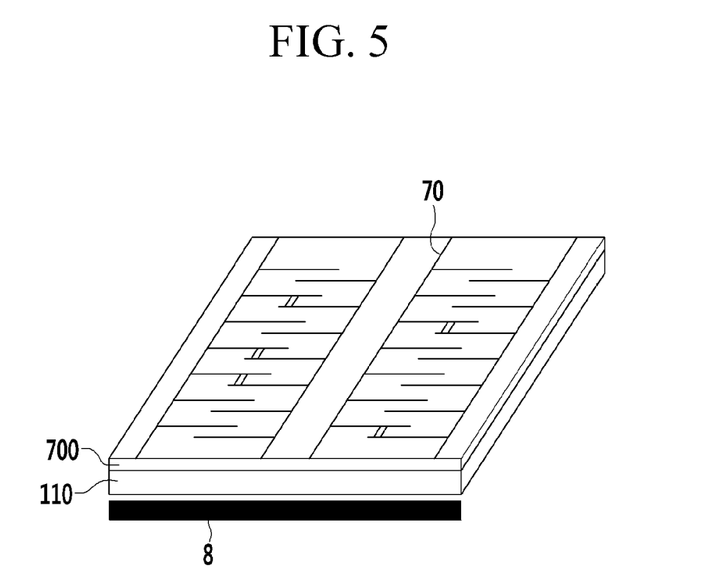

Referring to FIG. 2, a photoreactive material composition 7 is disposed, such as by coating, on a substrate 110. The photoreactive material composition 7 may be coated by a method such as spin coating. The photoreactive material composition 7 includes a photoreactive material 70 (refer to FIG.

5) and a solvent. The photoreactive material 70 includes at least one main chain and at least one side chain connected to the at least one main chain. The side chain may include at least one photoreactive group, and the main chain may include at least one photoreactive group. The photoreactive material composition 7 may further include a monomer, and the monomer may include a photoreactive group. Further, at least one of the main chain and the side chain may include at least one vertical functional group. In exemplary embodiments, for example, the photoreactive material 70 may be a photoreactive liquid crystal polymer. In one exemplary embodiment, for example, the photoreactive material 70 may be an acrylic compound, a methacrylic compound, a siloxane-based compound or a maleimide-based compound, such as a polyimide ("PI") or a polyamic acid ("PAA")-based organic material.

The photoreactive group is a functional group that directly causes a photo-dimerization reaction or a photo-isomerization reaction by radiation of light such as UV rays. In exemplary embodiments, for example, the photoreactive group may include at least one of an azo-based functional group, a cinnamate-based functional group, a chalcone-based functional group, a coumarin-based functional group, a maleimide-based functional group and a stilbene-based functional group.

The vertical functional group is one exhibiting a liquid crystal property. In exemplary embodiments, for example, the vertical functional group may include at least one of a $C_1$-$C_{25}$ alkylene group substituted by an alkyl group or an alkoxy group, a $C_1$-$C_{25}$ arylene group substituted by an alkyl group or an alkoxy group, a $C_1$-$C_{25}$ cyclohexylene group substituted by an alkyl group or an alkoxy group, an imide ring group, a steroid group, an aromatic liquid crystal group, and a cholesteric group. In the vertical functional group, at least one arylene group and at least one cyclohexylene group may be connected to each other directly or through a $C_1$-$C_5$ alkylene group.

The solvent may be an organic solvent. Examples of the organic solvent include, but are not limited to, cyclopentanol; a halogen-based solvent such as 1-chlorobutane, chlorobenzene, 1,1-dichloroethane, 1,2-dichloroethane, chloroform, and 1,1,2,2-tetrachloroethane; an ether-based solvent such as diethyl ether, tetrahydrofuran, and 1,4-dioxane; a ketone-based solvent such as methyl ethyl ketone ("MEK"), acetone, and cyclohexanone; an acetate-based solvent such as propylene glycol monomethyl ether acetate ("PGMEA"); an ester-based solvent such as ethyl acetate; an acetate-based solvent such as y-butyrolactone; a lactone-based solvent such as an ester-based solvent such as ethyl acetate; a carbonate-based solvent such as ethylene carbonate and propylene carbonate; an amine-based solvent such as triethylamine and pyridine; a nitrile-based solvent such as acetonitrile; an amide-based solvent such as N,N'-dimethyl formamide ("DMF"), N,N'-dimethyl acetamide ("DMAc"), tetramethylurea, and N-methylpyrrolidone ("NMP"); a nitro-based solvent such as nitromethane and nitrobenzene; a sulfide-based solvent such as dimethyl sulfoxide ("DMSO") and sulfolane; a phosphate-based solvent such as hexamethylphosphoric amide and tri-n-butyl phosphate, or a combination thereof.

Figure 3:
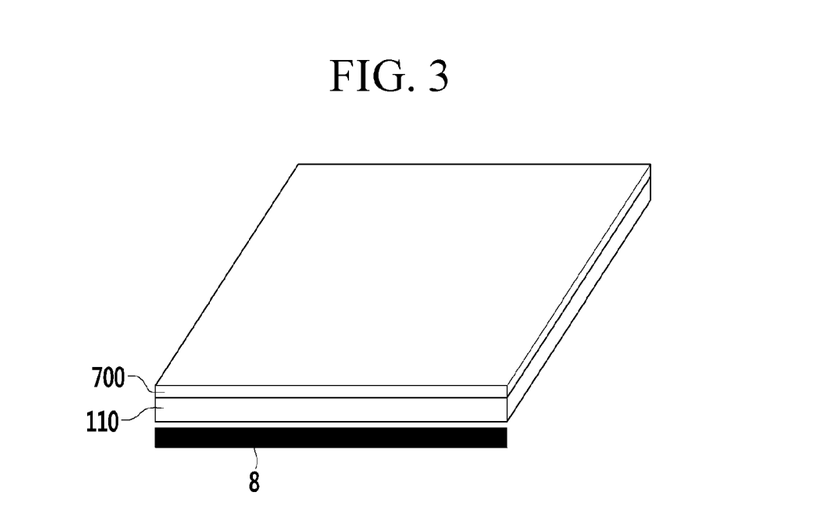

Referring to FIG. 3, the photoreactive material composition 7 is thermal-treated by using a heating source 8, such that the solvent may be removed from the photoreactive material composition 7 and a photo-alignment layer 700 may be formed. This operation may be otherwise referred to as a prebake.

The pre-baking may be performed by applying heat for about 60 seconds to about 80 seconds at a temperature of about 70° C. to about 80° C.

Figure 4:
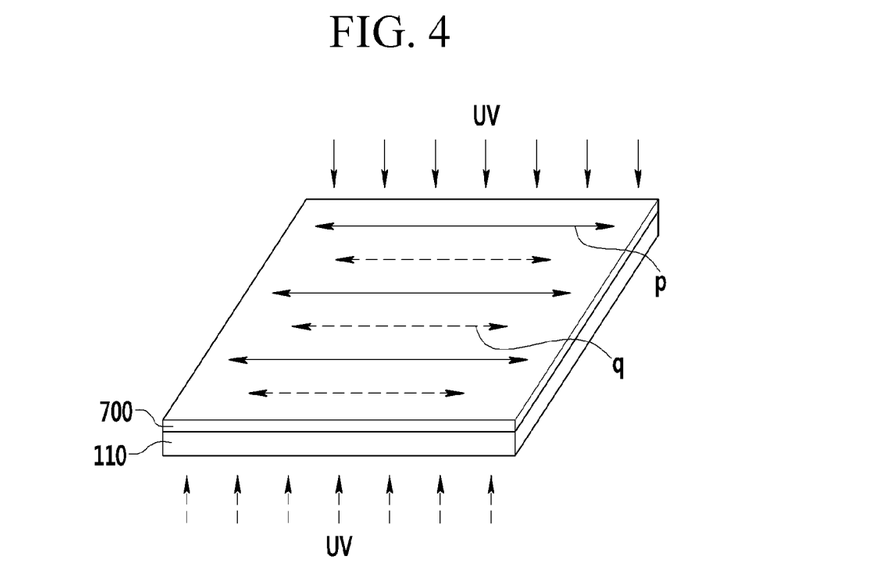

Referring to FIG. 4, light such as UV rays may be irradiated on one surface or both of opposing surfaces of the photo-alignment layer 700, such that the photoreactive group in the side chain of the photoreactive material 70 may be cross-linked with the photoreactive group in another side chain. In the illustrated exemplary embodiment, for example, the photoreactive material 70 of the photo-alignment layer 700 may be aligned in a p direction on the upper surface of the photo-alignment layer 700 by light radiated on the upper surface, and the photoreactive material 70 of the photo-alignment layer 700 may be aligned in a q direction on the lower surface of the photo-alignment layer 700 by light radiated on the lower surface.

Referring to FIG. 5, the photo-alignment layer 700 is further heat treated by using the heat source 8, such that the photoreactive material 70 may be uniformly aligned by reorienting an entire of the photoreactive material 70 of the photo-alignment layer 700. In the illustrated exemplary embodiment, for example, the main chains may be aligned by aligning the side chains that are not cross-linked in the photoreactive material 70. This operation is otherwise referred to as a post-bake or a thermal-treatment.

An exemplary embodiment of the post-bake or thermal-treatment operation of the photo-alignment layer 700 according to the invention is divided into two processes.

Through the thermal-treatment operation, the side chain arranged in a predetermined direction by the irradiation of the light such as UV rays and the main chain connected with the side chain are hardened. That is, energy is applied to an unstable dangling coupling thereby stabilizing the shape of the polymer including a new coupling and improving anisotropy of the photoreactive materials, or imidization is generated when using a polyimide or polyamic acid as the polymer.

However, when only generally performing the first thermal-treatment, a rigidity of the photoreactive material polymer is increased by the imidization of the polyimide or polyamic acid such that the stability of the polymer shape and the anisotropy of the photoreactive materials may be decreased.

In general, a thermal-treatment temperature range to maximize the stability of the polymer shape and the anisotropy of the photoreactive materials is lower than the thermal-treatment temperature range to maximize the imidization of the photoreactive material such as the polyimide or polyamic acid.

Accordingly, the thermal-treatment operation of the photo-alignment layer 700 is performed in two processes, where the first thermal-treatment operation is performed in a temperature range at which the stability of the polymer shape and the anisotropy of the photoreactive materials may be increased and the imidization is not well generated, and the second thermal-treatment operation is performed in a temperature range that is higher than that of the first thermal-treatment operation and at which the imidization of the polymer reaction material may be maximized.

Accordingly, in the exemplary embodiment of the manufacturing method of the photo-alignment layer according to the invention, among the multiple processes of the thermal-treatment after the irradiation of the UV rays for the photo-alignment layer, the first thermal-treatment operation may be performed for about 20 minutes to about 40 minutes at about 140° C. to about 180° C., and the second thermal-treatment operation may be performed for about 40 minutes at about 190° C. to about 230° C.

Next, a configuration of a general photo-alignment layer will be described with reference to FIG. 6.

Figure 6:
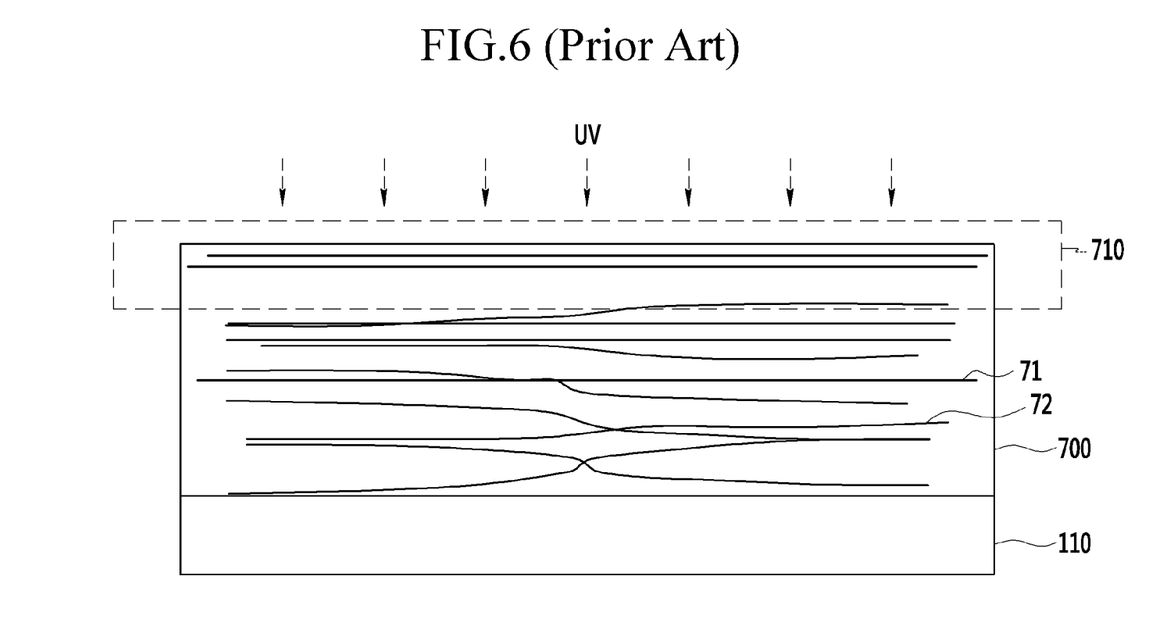
FIG. 6 is a schematic cross-sectional view of a conventional photo-alignment layer as a comparative example.

FIG. 6 is a schematic cross-sectional view of a conventional photo-alignment layer as a comparative example.

A photo-alignment layer 700 is positioned on a substrate 110. The substrate 110 may include a transparent material such as glass or plastic. The photo-alignment layer 700 includes photoreactive materials 71 and 72 that are uniformly aligned.

Referring to FIG. 6, when the light is irradiated to an upper surface 710 of the photo-alignment layer 700 and the photo-alignment layer 700 is thermal-treated, the alignment characteristic of the photoreactive material 71 is uniform at the upper part nearest the upper surface 710 of the photo-alignment layer 700 and the alignment property of the photoreactive material 72 is not uniform. The alignment of the photoreactive materials 71 and 72 is non-uniform at other parts, e.g., a lower surface and an inside, of the photo-alignment layer 700 such that a phase difference may be reduced and a refractive index may be reduced. Further, a black light leakage phenomenon may be increased and white luminance may be decreased, such that the contrast ratio of a display panel including the photo-alignment layer 700 may be decreased. The alignment property of the photoreactive material 72 disposed on the lower surface of the photo-alignment layer 700 may be deteriorated, and the alignment induction by heat may be deteriorated on both the upper and lower parts of the photo-alignment layer 700. In addition, even where the radiation quantity of light is increased during exposure of the section, the side reaction due to light may be increased to decrease the alignment property on both the upper and lower parts of the photo-alignment layer 700.

Next, an exemplary embodiment of a liquid crystal display including a photo-alignment layer according to the invention will be described with reference to FIG. 7 and FIG. 8.

Figure 7:
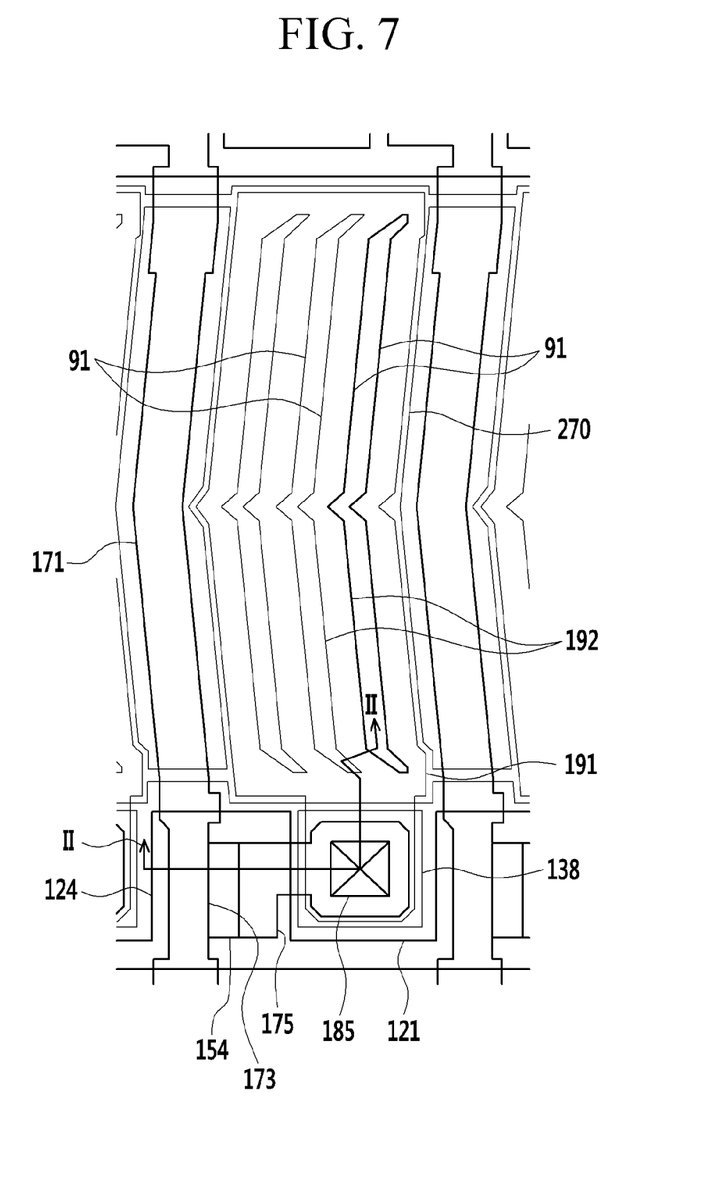
FIG. 7 is a top plan view of an exemplary embodiment of a liquid crystal display according to the invention.

FIG. 7 is a top plan view of an exemplary embodiment of a liquid crystal display according to the invention. FIG. 8 is a cross-sectional view taken along line II-II of FIG. 7.

Figure 8:
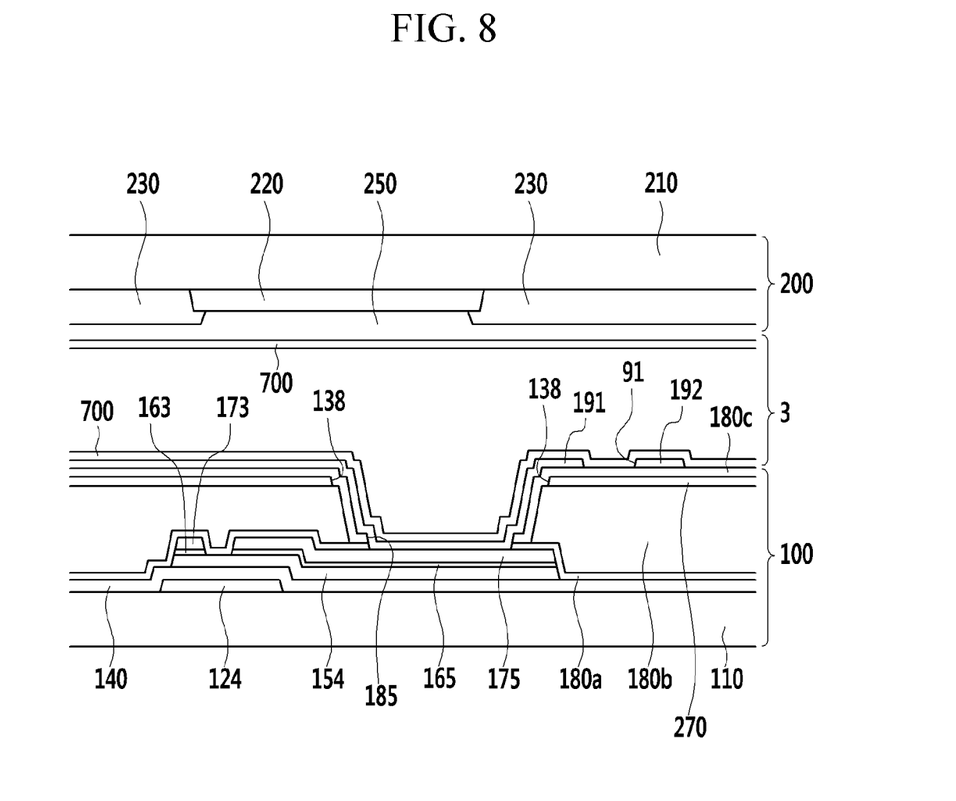
FIG. 8 is a cross-sectional view taken along line II-II of FIG. 7.

Referring to FIG. 7 and FIG. 8, the liquid crystal display includes a lower display panel 100 and an upper display panel 200, and a liquid crystal layer 3 interposed therebetween.

Firstly, the lower display panel 100 will be described.

A gate conductor including a gate line 121 is disposed on a first substrate 110 including transparent glass or plastic.

The gate line 121 includes a gate electrode 124 and an end portion (not shown) for connection with another layer or an external driving circuit. The gate line 121 may include aluminum (Al) or an aluminum-based metal such as an aluminum alloy, silver (Ag) or a silver-based metal such as a silver alloy, copper (Cu) or a copper-based metal such as a copper alloy, molybdenum (Mo) or a molybdenum-based metal such as a molybdenum alloy, chromium (Cr), tantalum (Ta) or titanium (Ti). The gate line 121, may have a single layer structure including one of the foregoing materials. However, the gate line 121 may have a multilayer structure including at least two conductive layers having different physical properties.

A gate insulating layer 140 including a silicon nitride (SiNx) or a silicon oxide (SiOx) is disposed on the gate line 121. The gate insulating layer 140 may have a single layer structure, or may have a multilayer structure including at least two insulating layers having different physical properties.

A semiconductor layer 154 including amorphous silicon or polysilicon is positioned on the gate insulating layer 140. The semiconductor layer 154 may include an oxide semiconductor.

Ohmic contacts 163 and 165 are disposed on the semiconductor layer 154. The ohmic contacts 163 and 165 may include a material such as n+ hydrogenated amorphous silicon on which an n-type impurity such as phosphorus is doped at a high concentration, or a silicide. The ohmic contacts 163 and 165 may be disposed as a pair on the semiconductor layer 154. When the semiconductor layer 154 is an oxide semiconductor, the ohmic contacts 163 and 165 may be omitted.

A data conductor including a data line 171 including a source electrode 173, and a drain electrode 175, is disposed on the ohmic contacts 163 and 165 and the gate insulating layer 140.

The data line 171 includes a wide end portion (not illustrated) for connection with another layer or an external driving circuit. The data line 171 transfers a data signal and extends mainly in a vertical direction in the plan view of FIG. 7, to cross the gate line 121.

The data line 171 may have a first curved portion having a curved shape to obtain maximum transmittance of the liquid crystal display. A pair of first curved portions may meet each other at an intermediate region of a pixel area to form a V shape. A second curved portion, which is curved to form a predetermined angle with the first curved portion, may be further disposed in the intermediate region of the pixel area.

The source electrode 173 is defined by a part of the data line 171 and is disposed on a same line as the data line 171. The drain electrode 175 is disposed to extend parallel to an extension direction of the source electrode 173. Therefore, the drain electrode 175 is parallel to a part of the data line 171.

The gate electrode 124, the source electrode 173 and the drain electrode 175 form a thin film transistor ("TFT") together with the semiconductor 154. A channel of the TFT is formed at a portion of the semiconductor 154 exposed between the source electrode 173 and the drain electrode 175.

In the illustrated exemplary embodiment, the liquid crystal display according to the invention includes the source electrode 173 positioned on the same line as the data line 171 and the drain electrode 175 extending parallel to the data line 171 so that a width of the TFT may be increased without increasing a planar area of the data conductor, thereby increasing the aperture ratio of the liquid crystal display. A width of the TFT may be taken in a horizontal direction, substantially perpendicular to the vertical direction in the plan view of FIG. 7, but is not limited thereto.

The data line 171 and the drain electrode 175 may include a refractory metal such as molybdenum, chromium, tantalum and titanium, or an alloy thereof. The data line 171 and/or the drain electrode 175 may have a single layer structure, or may have a multilayer structure including a refractory metal layer (not illustrated) and a low resistance conductive layer (not illustrated). Examples of the multilayer structure include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer.

A first passivation layer 180a is disposed on the data conductor 171, 173 and 175, the gate insulating layer 140, and the exposed portion of the semiconductor 154. The first passivation layer 180a may include an organic insulating material and/or an inorganic insulating material.

A second passivation layer 180b is disposed on the first passivation layer 180a. The second passivation layer 180b may include the organic insulating material.

In an exemplary embodiment, the second passivation layer 180b may be a color filter. When the second passivation layer 180b is the color filter, the second passivation layer 180b may inherently display one of primary colors. Examples of the primary colors may include three primary colors such as red, green and blue, or yellow, cyan and magenta. When the second passivation layer 180b is the color filter, a color filter 230 may be omitted from the upper display panel 200 that will be described later.

A common electrode 270 is positioned on the second passivation layer 180b. The common electrode 270 has a planar shape, may be disposed on an entire first substrate 110 as a plate, and may have an opening 138 defined in the region corresponding to the periphery of the drain electrode 175. That is, since a remaining portion of the common electrode 270 other than the region corresponding to the periphery of the drain electrode 175 excludes an opening, the common electrode 270 may have the planar shape.

A plurality of common electrodes 270 positioned at adjacent pixels are connected to each other to receive a common voltage of a predetermined level supplied from outside of a display area of the liquid crystal display.

An insulating layer 180c is disposed on the common electrode 270. The insulating layer 180c may include the organic insulating material and/or the inorganic insulating material.

A pixel electrode 191 is positioned on the insulating layer 180c. The pixel electrode 191 includes a curved edge which is substantially parallel to the first curved portion and the second curved portion of the data line 171. A plurality of cutouts 91 is defined in the pixel electrode 191 and a plurality of branch electrodes 192 of the pixel electrode 191 is defined between adjacent cutouts 91.

The pixel electrode 191 is a first field generating electrode or a first electrode of the liquid crystal display panel, and the common electrode 270 is a second field generating electrode or a second electrode of the liquid crystal display panel. The pixel electrode 191 and the common electrode 270 may form a horizontal electric field.

A first contact hole 185 is defined extended through the first passivation layer 180a, the second passivation layer 180b and the insulating layer 180c and exposes the drain electrode 175. The pixel electrode 191 is physically and electrically connected to the drain electrode 175 through the first contact hole 185 to receive a voltage from the drain electrode 175.

A first alignment layer 11 is disposed on the pixel electrode 191 and the insulating layer 180c. The first alignment layer 11 may be a photo-alignment layer. In exemplary embodiments, the first alignment layer 11 includes the photoreactive material, and the photoreactive material may be the organic material of the polyimide or polyamic acid based material. The first alignment layer 11 may include any one of various exemplary embodiments of the photo-alignment layer 700 previously described herein.

An exemplary embodiment of a method of forming the photo-alignment layer 11 is substantially the same as that described in FIG. 3 to FIG. 6 such that the repeated description is omitted.

Next, the upper display panel 200 will be described.

A light blocking member 220 is disposed on a second substrate 210 including transparent glass, plastic, or the like. The light blocking member 220 may be otherwise referred to as a black matrix and blocks light leakage.

A plurality of color filters 230 is disposed on the second substrate 210. Where the second passivation layer 180b of the lower display panel 100 is a color filter, the color filter 230 of the upper display panel 200 may be omitted. Further, in an alternative exemplary embodiment, the light blocking member 220 of the upper display panel 200 may be disposed in the lower display panel 100.

An overcoat 250 is disposed on the color filter 230 and the light blocking member 220. The overcoat 250 may include an (organic) insulator, reduces or effectively prevents exposure of the color filter 230, and provides a flat surface. In an alternative exemplary embodiment, the overcoat 250 may be omitted.

A second alignment layer 21 is disposed on the overcoat 250. The second alignment layer 21 may be a photo-alignment layer. The second alignment layer 21 includes the photoreactive material. The second alignment layer 21 may include the same material and be formed by the same method as the above-described first alignment layer 11. The second alignment layer 21 may include any one of various exemplary embodiments of the photo-alignment layer 700 previously described herein.

The liquid crystal layer 3 may include a liquid crystal material having positive dielectric anisotropy.

Liquid crystal molecules of the liquid crystal layer 3 may be aligned so that long axes thereof are parallel to the surfaces of the two display panels 100 and 200.

The pixel electrode 191 is applied with the data voltage from the drain electrode 175, and the common electrode 270 is applied with the common voltage of a predetermined level from a common voltage application unit (not shown) disposed outside the display area of the liquid crystal display.

The pixel electrode 191 and the common electrode 270 as field generating electrodes of the liquid crystal display, generate an electrical field such that the liquid crystal molecules of the liquid crystal layer 3 positioned thereon are rotated in a direction parallel to the direction of the electric field. As described above, according to the determined rotation direction of the liquid crystal molecules, the polarization of light passing through the liquid crystal layer is changed.

As described above, by forming the two field generating electrodes 191 and 270 within one display panel, e.g., the lower display panel 100, transmittance of the liquid crystal display is increased and a wide viewing angle may be realized.

According to the illustrated exemplary embodiment of the liquid crystal display, the common electrode 270 has the planar shape and the pixel electrode 191 includes a plurality of branch electrodes defined therein. However, in an alternative exemplary embodiment of a liquid crystal display according to the invention, the pixel electrode 191 may have a planar shape and the common electrode 270 may include a plurality of branch electrodes defined therein.

One or more exemplary embodiment of the invention is applicable to all configurations in which two field generating electrodes overlap via an insulating layer on the first substrate 110, the first field generating electrode under the insulating layer has the plane shape, and the second field generating electrode on the insulating layer includes a plurality of branch electrodes defined therein.

Next, a result of measuring the anisotropy of the liquid crystal molecule in the liquid crystal display applied with the photo-alignment layer manufactured through the thermal-treatment of two processes according to an exemplary embodiment of the manufacturing method according to the invention will be described. As a comparative example, the anisotropy of a liquid crystal molecule in a liquid crystal display applied with the photo-alignment layer manufactured through a one process thermal-treatment according to a conventional manufacturing method of a photo-alignment layer is also measured. An exposure amount of UV rays is varied 1 joule (J) and 2 joules (J), and the results thereof are shown in FIG. 9.

Figure 9:
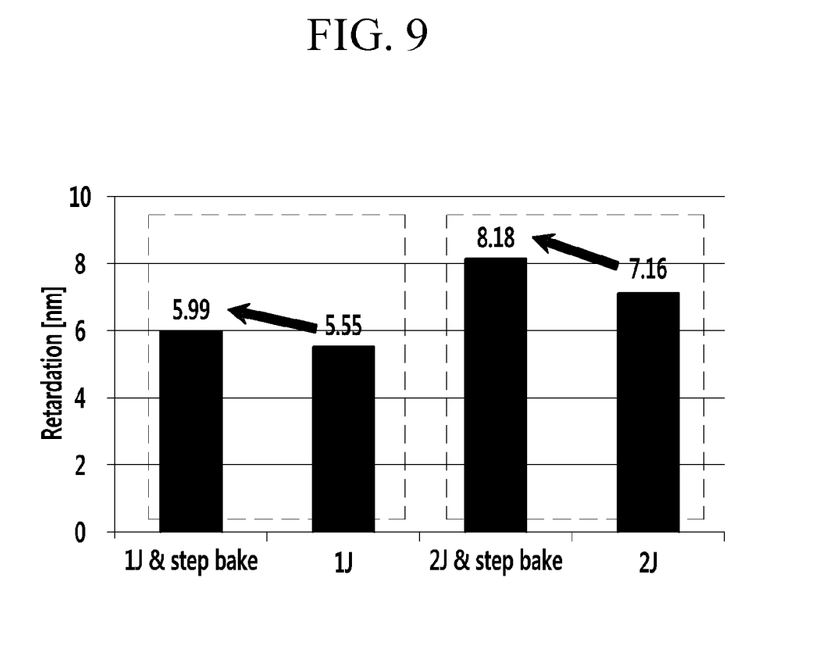
FIG. 9 is a graph showing a result of measuring anisotropy of a liquid crystal molecule in a liquid crystal display using a photo-alignment layer manufactured by an exemplary embodiment of a manufacturing method according to the invention.

In FIG. 9, the vertical axis represents the anisotropy. For each pair of bars, the left side horizontal axis bar represents the measuring result of the photo-alignment layer according to the exemplary embodiment of the manufacturing method including the thermal-treatment of two processes ('step bake') according to the invention, and the right side horizontal axis bar represents the measuring result of the photo-alignment layer according to the conventional manufacturing method including the one process thermal-treatment.

As shown in FIG. 9, where the exposure amount is 1 J, the anisotropy of the liquid crystal molecule of the exemplary embodiment of the photo-alignment layer according to the invention is increased from 5.55 nanometers (nm) to 5.99 nm, while where the exposure amount is 2 J, the anisotropy of the liquid crystal molecule of the exemplary embodiment of the photo-alignment layer according to the invention is increased from 7.16 nm to 8.18 nm.

Figure 10:
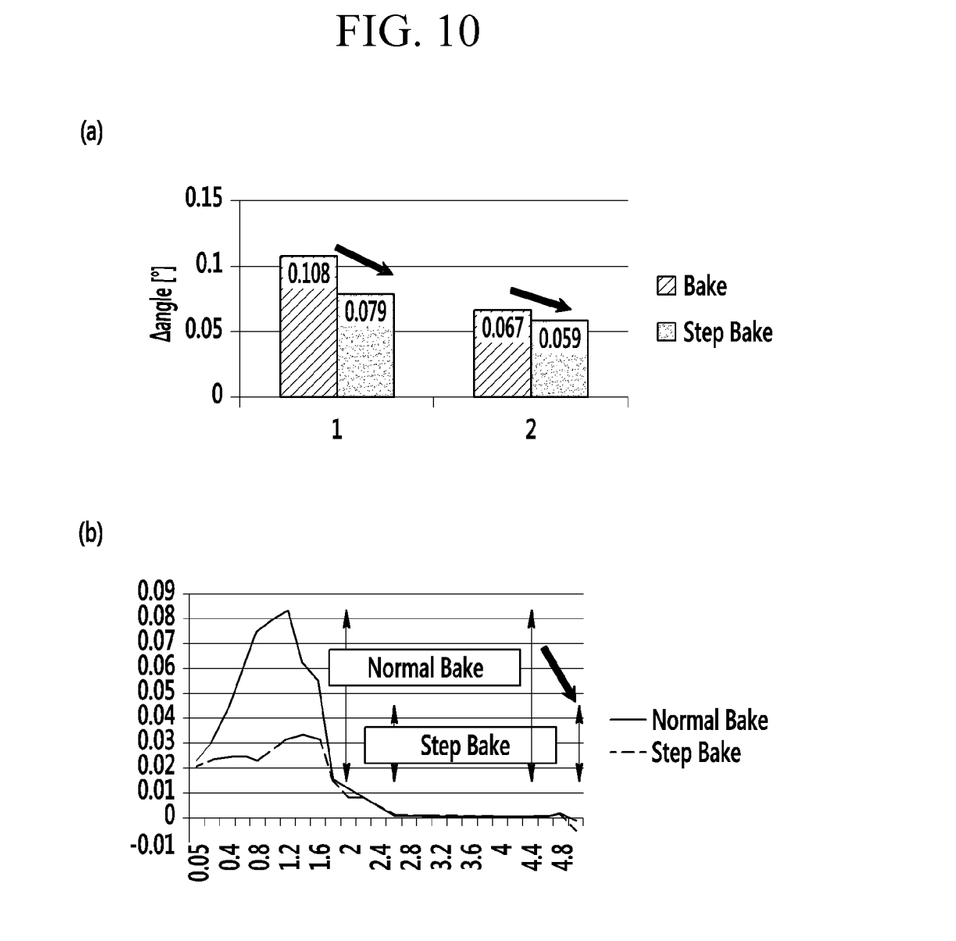
FIG. 10 is a graph showing a result of measuring an initial liquid crystal alignment angle of a liquid crystal molecule, a difference of a liquid crystal angle changed after an afterimage, and a luminance difference after the afterimage in a liquid crystal display using a photo-alignment layer manufactured by an exemplary embodiment of a manufacturing method according to the invention.

Also, in the liquid crystal display applied with the photo-alignment layer manufactured through the exemplary embodiment of the manufacturing method including the thermal-treatment of two processes according to the invention, an initial angle of the liquid crystal molecule, a difference of the angle changed after an afterimage, and a luminance difference according to a voltage after the afterimage are measured. As a comparative example, in the liquid crystal display applied with the photo-alignment layer manufactured through the one process thermal-treatment according to the conventional manufacturing method, the difference between the initial angle of the liquid crystal molecules and the angle changed after the afterimage and the luminance difference according to the voltage after the afterimage are also measured. The results thereof are respectively shown in FIGS. 10(a) and (b).

The vertical axis of FIG. 10(a) represents the difference in degrees (°) between the initial angle of the liquid crystal molecule and the liquid crystal angle changed after the afterimage ($\Delta$angle). As shown in FIG. 10(a), for each pair of bars, when comparing the conventional photo-alignment layer ('Bake') with the photo-alignment layer manufactured through the exemplary embodiment of the manufacturing method including the two processes of thermal-treatment according to the invention ('Step Bake'), the difference between the initial angle of the liquid crystal molecule and the liquid crystal angle changed after the afterimage is reduced.

The vertical axis of FIG. 10(b) represents the luminance difference between the initial and after the afterimage, the horizontal axis represents the voltage. As shown in FIG. 10(b), when comparing the conventional photo-alignment layer ('Normal Bake') with the photo-alignment layer manufactured through the exemplary embodiment of the manufacturing method including the two processes of thermal-treatment according to the invention ('Step Bake'), the luminance difference between the initial and after the afterimage is reduced.

Accordingly, in the liquid crystal display applied with the photo-alignment layer formed by one or more exemplary embodiment of the manufacturing method according to the invention, it may be confirmed that the afterimage is improved.

Also, in the liquid crystal display applied with the photo-alignment layer manufactured through an exemplary embodiment of the manufacturing method including the two processes of thermal-treatment according to the invention, a black luminance according to a voltage is measured. As a comparative example, in the liquid crystal display applied with the photo-alignment layer manufactured through the one process thermal-treatment according to the conventional manufacturing method, the black luminance according to the voltage is also measured. The results thereof are shown in FIG. 11.

Figure 11:
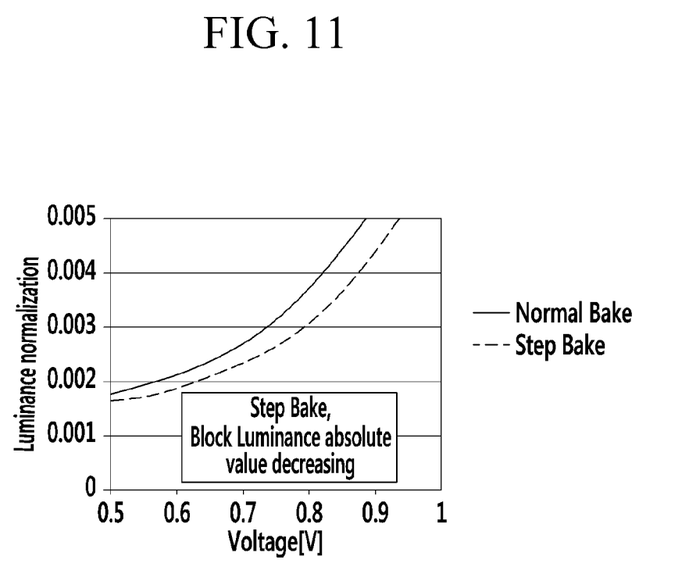
FIG. 11 is a graph measuring a black luminance according to a voltage of a liquid crystal display using a photo-alignment layer manufactured by an exemplary embodiment of a manufacturing method according to the invention.

In FIG. 11, the horizontal axis represents the voltage in volts (V), and the vertical axis represents an absolute value of the black luminance.

As shown in FIG. 11, when comparing the conventional photo-alignment layer ('Normal Bake') with the photo-alignment layer manufactured through the exemplary embodiment of the manufacturing method including the two processes of thermal-treatment according to the invention ('Step Bake'), it may be confirmed that the absolute value of the black luminance according to the voltage is reduced.

Accordingly, in the liquid crystal display applied with the photo-alignment layer according to one or more exemplary embodiment of the manufacturing method according to the invention, it may be confirmed that the black luminance is improved.

As described above, one or more exemplary embodiment of the manufacturing method of the photo-alignment layer according to the invention includes the thermal-treatment of the photo-alignment layer by two processes. In detail, the thermal-treatment of the photo-alignment layer is performed two times at different temperatures to improve the alignment characteristic of the photoreactive material in the photo-alignment layer such that the afterimage, the luminance and the contrast ratio of the liquid crystal display including the photo-alignment layer may be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a photo-alignment layer, comprising:
   disposing a polymer material on a substrate;
   pre-baking the polymer material disposed on the substrate;
   irradiating a light to the pre-baked polymer material, to photo-align the pre-baked polymer material; and
   thermal-treating the irradiated pre-baked polymer material, to harden the irradiated pre-baked polymer material,
   wherein the thermal-treating comprises a first thermal-treatment, and a second thermal-treatment at a higher temperature than that of the first thermal-treatment.

2. The method of claim 1, wherein
   the polymer material comprises a main chain and a side chain.

3. The method of claim 1, wherein
   the polymer material comprises a polyimide or polyamic acid.

4. The method of claim 3, wherein
   the first thermal-treatment is performed at a temperature of about 140 degrees Celsius to about 180 degrees Celsius, and
   the second thermal-treatment is performed at a temperature of about 190 degrees Celsius to about 230 degrees Celsius.

5. The method of claim 4, wherein
   the first thermal-treatment and the second thermal-treatment are performed for about 20 minutes to about 40 minutes.

6. The method of claim 4, wherein
   the first thermal-treatment stabilizes a polymer shape and increases anisotropy of the polymer material.

7. The method of claim 4, wherein
the second thermal-treatment imidizes the polyimide or the polyamic acid of the polymer material.

8. The method of claim 1, wherein
the pre-baking is performed at a temperature of about 70 degrees Celsius to about 80 degrees Celsius.

9. The method of claim 8, wherein
the pre-baking is performed for about 60 seconds to about 80 seconds.

10. The method of claim 1, wherein
the light comprises ultraviolet rays.

11. A method of manufacturing a liquid crystal display, comprising:
   forming a thin film transistor on a first substrate;
   forming a passivation layer on the thin film transistor;
   forming a first electrode and a second electrode positioned via an insulating layer interposed therebetween, on the passivation layer; and
   forming a first photo-alignment layer on the first electrode or the second electrode,
   wherein the forming the first photo-alignment layer comprises:
      disposing a polymer material on the first electrode or the second electrode,
      pre-baking the polymer material disposed on the first electrode or the second electrode,
      irradiating a light to the pre-baked polymer material, to photo-align the pre-baked polymer material, and
      thermal-treating the irradiated pre-baked polymer material, to harden the irradiated pre-baked polymer material,
      wherein the thermal-treating comprises a first thermal-treatment, and a second thermal-treatment at a higher temperature than that of the first thermal-treatment.

12. The method of claim 11, further comprising
forming a second photo-alignment layer on a second substrate facing the first substrate.

13. The method of claim 11, wherein
the polymer material comprises a polyimide or polyamic acid.

14. The method of claim 13, wherein,
the first thermal-treatment is performed at a temperature of about 140 degrees Celsius to about 180 degrees Celsius, and
the second thermal-treatment is performed at a temperature of about 190 degrees Celsius to about 230 Celsius.

15. The method of claim 14, wherein
the first thermal-treatment and the second thermal-treatment are performed for about 20 minutes to about 40 minutes.

16. The method of claim 14, wherein:
the first thermal-treatment stabilizes a polymer shape and increases anisotropy of the polymer material.

17. The method of claim 14, wherein
the second thermal-treatment imidizes the polyimide or the polyamic acid of the polymer material.

18. The method of claim 11, wherein
the pre-baking is performed at a temperature of about 70 degrees Celsius to about 80 degrees Celsius.

19. The method of claim 18, wherein
the pre-baking is performed for about 60 seconds to about 80 seconds.

20. The method of claim 11, wherein
the light comprises ultraviolet rays.

* * * * *